(12) United States Patent
Butler et al.

(10) Patent No.: US 8,111,452 B2
(45) Date of Patent: Feb. 7, 2012

(54) WAVELENGTH CONVERSION DEVICE WITH MICROLENS AND OPTICAL PACKAGE INCORPORATING THE SAME

(75) Inventors: Douglas Llewellyn Butler, Painted Post, NY (US); Martin Hai Hu, Painted Post, NY (US); Anping Liu, Big Flats, NY (US)

(73) Assignee: Corning Incorporated, Corning, NY (US)

( * ) Notice: Subject to any disclaimer, the term of this patent is extended or adjusted under 35 U.S.C. 154(b) by 235 days.

(21) Appl. No.: 12/709,719

(22) Filed: Feb. 22, 2010

(65) Prior Publication Data

US 2011/0205619 A1     Aug. 25, 2011

(51) Int. Cl.
*G02F 2/02*     (2006.01)
*H01S 3/10*     (2006.01)
(52) U.S. Cl. ......... 359/332; 359/326; 372/22; 372/50.1; 372/102
(58) Field of Classification Search .................. None
See application file for complete search history.

(56) References Cited

U.S. PATENT DOCUMENTS

| | | | |
|---|---|---|---|
| 4,951,293 A * | 8/1990 | Yamamoto et al. | 372/50.1 |
| 5,247,528 A | 9/1993 | Shinozaki et al. | |
| 5,412,502 A | 5/1995 | Makio et al. | |
| 5,418,802 A | 5/1995 | Chwalek | |
| 5,459,744 A | 10/1995 | Hayashi | |
| 5,517,525 A | 5/1996 | Endo et al. | |
| 5,570,444 A | 10/1996 | Janssen et al. | |
| 5,644,584 A | 7/1997 | Nam et al. | |
| 5,801,876 A | 9/1998 | Kouta | |
| 5,805,630 A | 9/1998 | Valster et al. | |
| 5,836,073 A | 11/1998 | Mizuuchi et al. | |
| 5,914,972 A | 6/1999 | Siala et al. | |
| 5,936,985 A | 8/1999 | Yamamoto et al. | |
| 5,940,557 A | 8/1999 | Harker | |
| 5,982,788 A | 11/1999 | Hemmati | |

(Continued)

FOREIGN PATENT DOCUMENTS

EP      0625811      11/1994

(Continued)

OTHER PUBLICATIONS

Office Action pertaining to U.S. Appl. No. 12/471,681 dated Aug. 24, 2010.

(Continued)

*Primary Examiner* — Hemang Sanghavi
(74) *Attorney, Agent, or Firm* — Joseph M. Homa

(57) ABSTRACT

An optical package is provided comprising a laser diode and a wavelength conversion device. The laser diode and the wavelength conversion device define an external laser cavity and the wavelength conversion device is tilted relative to the output face of the laser diode to define a tilt angle φ that is less than approximately 85°. The input face of the wavelength conversion device comprises a pair of tapered facets and a microlens. The pair of tapered facets and the microlens are defined on the input face such that they share respective portions of the facial waveguide region on the input face, with the tapered facets occupying peripheral portions of the facial waveguide region on the input face and the microlens occupying an interior portion of the facial waveguide region on the input face. Each of the pair of tapered facets define a facet angle α within the facial waveguide region that is less than the facet angle α and is greater than approximately 45°. Additional embodiments are disclosed and claimed.

18 Claims, 2 Drawing Sheets

U.S. PATENT DOCUMENTS

| | | |
|---|---|---|
| 6,056,447 A | 5/2000 | Caras |
| 6,064,512 A | 5/2000 | Byer et al. |
| 6,093,939 A | 7/2000 | Artigue et al. |
| 6,307,657 B1 | 10/2001 | Ford |
| 6,317,546 B1 | 11/2001 | Kasazumi et al. |
| 6,360,041 B1 | 3/2002 | Nakama et al. |
| 6,381,387 B1 | 4/2002 | Wendland, Jr. |
| 6,441,970 B2 | 8/2002 | Kasazumi et al. |
| 6,721,479 B2 | 4/2004 | Lasecki et al. |
| 6,724,959 B1 | 4/2004 | Takahashi et al. |
| 6,785,457 B2 | 8/2004 | Mizuuchi et al. |
| 6,996,140 B2 | 2/2006 | Waarts et al. |
| 7,027,209 B2 | 4/2006 | Zanger et al. |
| 7,173,950 B2 | 2/2007 | Hand et al. |
| 7,177,340 B2 | 2/2007 | Lang et al. |
| 7,474,678 B2 | 1/2009 | Heo et al. |
| 2001/0055446 A1 | 12/2001 | Iwashita et al. |
| 2002/0024978 A1 | 2/2002 | Inagaki et al. |
| 2002/0154866 A1 | 10/2002 | Tombling et al. |
| 2002/0159489 A1 | 10/2002 | Wolak et al. |
| 2003/0035229 A1 | 2/2003 | Willis |
| 2003/0095326 A1 | 5/2003 | Dijaili et al. |
| 2003/0108304 A1 | 6/2003 | Ziari et al. |
| 2003/0161379 A1 | 8/2003 | Wolak et al. |
| 2004/0057686 A1 | 3/2004 | Steinberg et al. |
| 2005/0068998 A1 | 3/2005 | Katsura et al. |
| 2005/0111079 A1 | 5/2005 | Wang et al. |
| 2006/0002436 A1 | 1/2006 | Takabayashi et al. |
| 2007/0014325 A1 | 1/2007 | Park et al. |
| 2007/0133638 A1 * | 6/2007 | Mizuuchi et al. ......... 372/50.11 |
| 2008/0317072 A1 | 12/2008 | Essaian et al. |

FOREIGN PATENT DOCUMENTS

| | | |
|---|---|---|
| EP | 1 239 559 A2 | 9/2002 |
| EP | 1387197 | 2/2004 |
| EP | 0 822 429 B1 | 6/2010 |
| WO | 2010/138478 | 12/2010 |

OTHER PUBLICATIONS

Office Action pertaining to U.S. Appl. No. 12/471,681 dated Dec. 28, 2010.

Office Action pertaining to U.S. Appl. No. 12/471,681 dated May 31, 2011.

Office Action pertaining to U.S. Appl. No. 12/471,666 dated Feb. 17, 2011.

Office Action pertaining to U.S. Appl. No. 12/471,666 dated Apr. 11, 2011.

Schiehlen, E. et al; Blue-green Emitting Semiconductor Disk Lasers with Intra-Cavity Frequency Doubling; Annual Report 2001; Optoelectronics Department, University of Ulm; pp. 1-6.

MacLean, A.J. et al; High power intracavity second harmonic generation in Vertical External Cavity Surface Emitting Lasers at 1060 nm; In: Photon 06; Sep. 4-7, 2006; Manchester, UK.

Fallahi, M. et al; Novel semiconductor lasers attractive for UV-visible applications; SPIE Newsroom; pp. 1-3; 10.1117/2.1200901.1473.

Akulova, Y.A. et al; Widely-Tunable Electroabsorption-Modulated Sampled Grating DBR Laser Integrated With Semiconductor Optical Amplifier; 2001 Optical Society of America.

Ito, K. et al. "Theoretical Study on Intra-Cavity Distributed-Bragg-Reflection Quasi-Phase-Matched Second-Harmonic Lasers" Optical Review, vol. 2, No. 5, 1995, pp. 371-376.

* cited by examiner

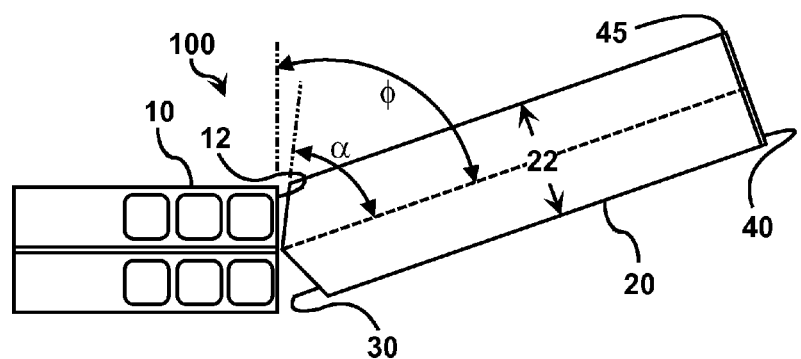
Fig. 1
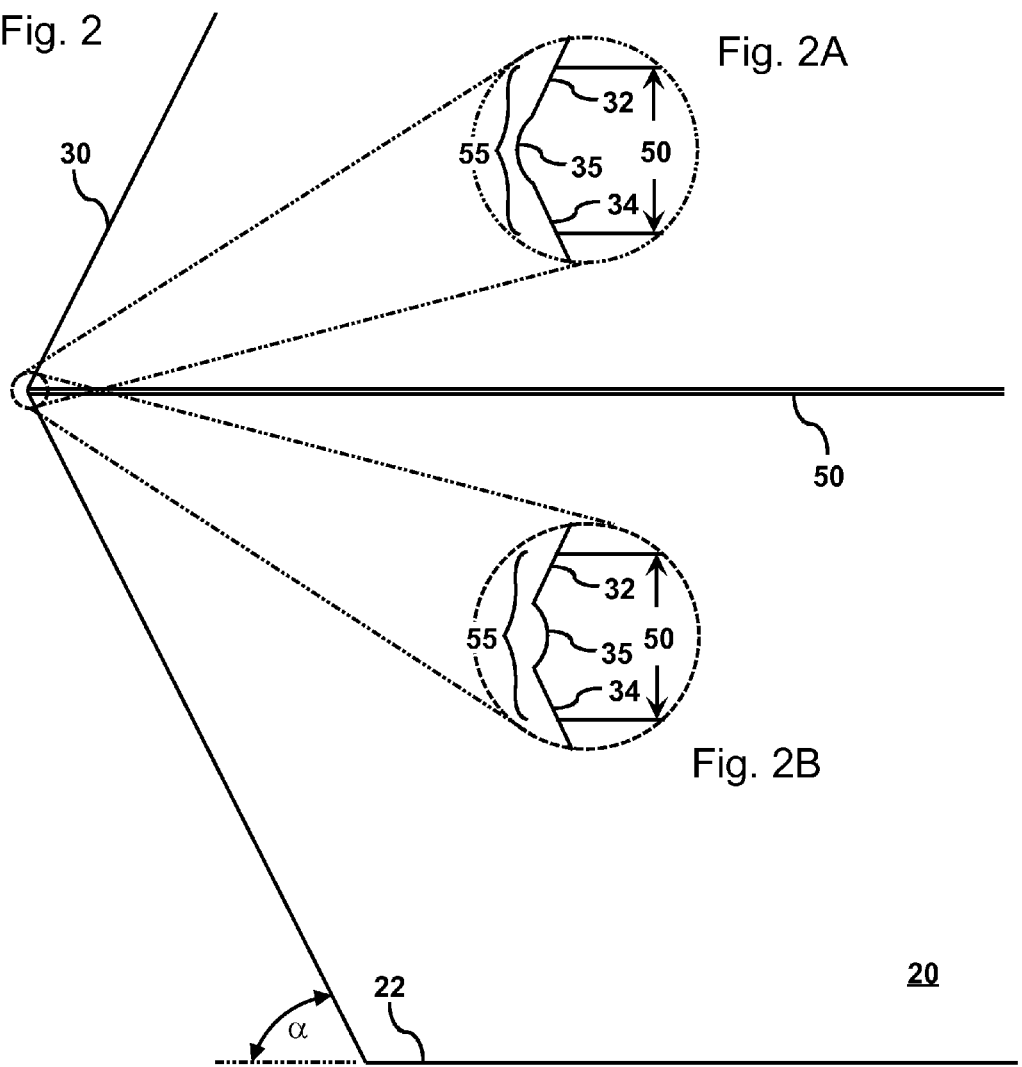
Fig. 2
Fig. 2A
Fig. 2B

WAVELENGTH CONVERSION DEVICE WITH MICROLENS AND OPTICAL PACKAGE INCORPORATING THE SAME

CROSS-REFERENCE TO RELATED APPLICATIONS

This application is related to U.S. patent application Ser. Nos. 12/471,666, filed May, 26, 2009, and 12/471,681, filed May, 26, 2009, but does not claim priority thereto.

BACKGROUND

The present disclosure relates to frequency-converted laser diodes, laser projection systems and, more particularly, to optical packaging configurations for laser diodes and multi-color laser projectors in applications such as cell phones, PDAs, laptop computers, etc.

BRIEF SUMMARY

The present inventors have recognized that frequency-converted laser diodes and multi-color laser projectors must be compact to be feasible for many projection applications. This object is particularly challenging in multi-color projection systems requiring three independent color sources (red, green, blue). Although red and blue sources are reasonably compact, frequency-converted green laser diodes present a particular challenge in this respect because they commonly utilize an IR laser diode and a second harmonic generation (SHG) crystal or some other type of wavelength conversion device. Active or passive coupling optics are often utilized to ensure proper alignment of the IR pump light with the waveguide of the SHG crystal. The package may also include hardware for enhancing mechanical stability over a wide temperature range. Together, these components increase overall package volume and operational complexity.

The concepts of the present disclosure relate generally to the design and configuration of wavelength conversion devices and, although not limited to proximity-coupled optical packages, embodiments contemplated herein are often well-suited for optical packages where the SHG crystal, or other type of wavelength conversion device, is placed in close proximity to the laser diode to eliminate the need for coupling optics, reduce the number of package components, and reduce package volume. According to one embodiment of the present disclosure, an optical package is provided comprising a laser diode and a wavelength conversion device. The laser diode and the wavelength conversion device define an external laser cavity and the wavelength conversion device is tilted relative to the output face of the laser diode to define a tilt angle $\phi$ that is less than approximately 85°. The input face of the wavelength conversion device comprises a pair of tapered facets and a microlens. The pair of tapered facets and the microlens are defined on the input face such that they share respective portions of the facial waveguide region on the input face, with the tapered facets occupying peripheral portions of the facial waveguide region on the input face and the microlens occupying an interior portion of the facial waveguide region on the input face. Each of the pair of tapered facets define a facet angle $\alpha$ within the facial waveguide region that is less than the tilt angle $\phi$ relative to the waveguide of the wavelength conversion device and is greater than approximately 45°. Additional embodiments are disclosed and claimed.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which:

FIG. 1 is a general illustration of a proximity-coupled optical package including a wavelength conversion device according to the present disclosure;

FIG. 2 is a schematic illustration of a wavelength conversion device according to the present disclosure;

FIGS. 2A and 2B are enlarged views of two alternative microlens configurations for use in a wavelength conversion device according to the present disclosure;

DETAILED DESCRIPTION

Figure 3:
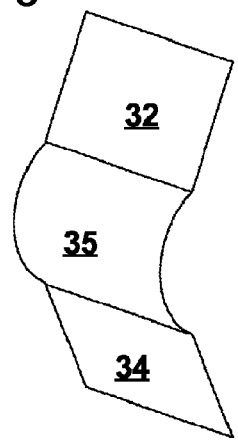
FIGS. 3-5 are further illustrations of alternative microlens configurations according to the present disclosure.

Referring initially to FIG. 1 concepts of the present disclosure may be described in the context of an optical package 100 comprising a laser diode 10 and a wavelength conversion device 20. The wavelength conversion device 20 comprises an input face 30, an output face 40, and a waveguide 50 extending from the input face 30 to the output face 40. The laser diode 10 and the wavelength conversion device 20 define an external laser cavity extending along an optical path between a wavelength selective component of the laser diode 10, which component may, for example, be presented as a distributed Bragg reflector in the laser diode 10, and an output reflector 45 of the optical package 100. As is illustrated in FIG. 1, the output reflector 45 may be formed as a partially reflective coating or other type of partially reflective element on the output face 40 of the wavelength conversion device 20. Alternatively, it is contemplated that the output reflector may be presented as an independent optical component of the optical package and need not be integrated with the wavelength conversion device 20.

Although the frequency-converted laser diode illustrated in FIG. 1 comprises an external laser cavity presented in the form of a DBR laser diode 10, an output reflector 45 presented as a partly reflective coating, a wavelength selective component presented as a distributed Bragg reflector in the DBR laser diode 10, a wavelength conversion device presented as a waveguide PPLN crystal 40 used for frequency doubling into the green wavelength range, it is noted that the concepts of the present disclosure are equally applicable to a variety of frequency-converted laser configurations including, but not limited to, configurations that utilize two or three-section DBR lasers, DFB lasers, Fabry-Perot lasers, external cavity lasers, etc., and configurations that utilize frequency conversion beyond second harmonic generation (SHG).

Regardless of the particular manner in which the external laser cavity is formed in practicing the concepts of the present disclosure, the waveguide 50, which extends from the input face 30 to the output face 40 within the external laser cavity defines an input facial waveguide region 55 on the input face 30 of the wavelength conversion device 30 and the laser diode 10 is positioned such that its output face 12 is proximity-coupled to the waveguide 50 of the wavelength conversion device 20. For the purposes of describing and defining the present invention, it is noted that a "proximity-coupled" optical package refers to an optical package where the majority of the optical coupling between the laser diode and the associated wavelength conversion device is attributable to the proximity at which the respective output and input faces are positioned. Typically, although not exclusively, the proximity is such that the laser diode can be optically coupled to the waveguide portion of the wavelength conversion device without the use of intervening optical components. For example, and not by way of limitation, it is contemplated that proximity spacing in a proximity coupled optical package will be less than approximately 20 µm.

Referring to FIG. 2, to further enhance optical coupling, the input face 30 of the wavelength conversion device 20 is provided with a pair of tapered facets 32, 34 and a microlens 35. As is illustrated schematically in FIGS. 2A and 2B and as is discussed in further detail below, the microlens 35 may define a generally concave or convex surface profile on the input face 30 and may take a variety of simple or complex forms. Regardless of the particular form of the microlens 35, the pair of tapered facets 32, 34 and the microlens 35 are defined on the input face 30 such that they share respective portions of the facial waveguide region 55 on the input face 30. As is illustrated in FIGS. 2A and 2B, the tapered facets 32, 34 occupy peripheral portions of the facial waveguide region 55 on the input face 30 while the microlens 35 occupies an interior portion of the facial waveguide region 55 on the input face 30.

Typically, although not required, the microlens 35 is bounded by the tapered facets 32, 34 on the input face 30 of the wavelength conversion device 20. In the illustrated embodiment, the tapered facets 32, 34 extend from the microlens 35 to respective edge portions 22 of the wavelength conversion device 20. The progressively larger degrees of scale represented in FIGS. 1, 2, and 2A & 2B, illustrate the fact that the tapered facets 32, 34 typically occupy a surface area on the input face 30 of the wavelength conversion device 20 that is at least two orders of magnitude larger than the surface area occupied by the microlens 35. FIGS. 2A and 2B also illustrate the fact that the microlens 35 is typically a relatively spherical or aspherical curved surface while the tapered facets 32, 34 are typically relatively planar surfaces, i.e., relative to each other.

As is illustrated in FIG. 1, the wavelength conversion device 20 is tilted relative to the output face 12 of the laser diode 10 to define a tilt angle $\phi$ that is typically less than 85° and most often significantly less than 85°, i.e., between 70° and 80°. To help facilitate proximity coupling in the context of a tilted wavelength conversion device 20, each of the pair of tapered facets 32, 34 define a facet angle $\alpha$ that is less than the tilt angle $\phi$ relative to the waveguide 50 of the wavelength conversion device 20. Although in many instances it will be most convenient to fashion the entire tapered facet along a unitary tilt angle $\phi$, compound tilt angles are also contemplated but the tapered facets 32, 34 should define a facet angle $\alpha$ that is less than the tilt angle $\phi$ at least within the facial waveguide region 55. To avoid undue losses in optical coupling efficiency, prevent crystal fracture, and otherwise preserve device robustness within the wavelength conversion device 20, the facet angle $\alpha$ should be greater than approximately 45°.

Figure 4:
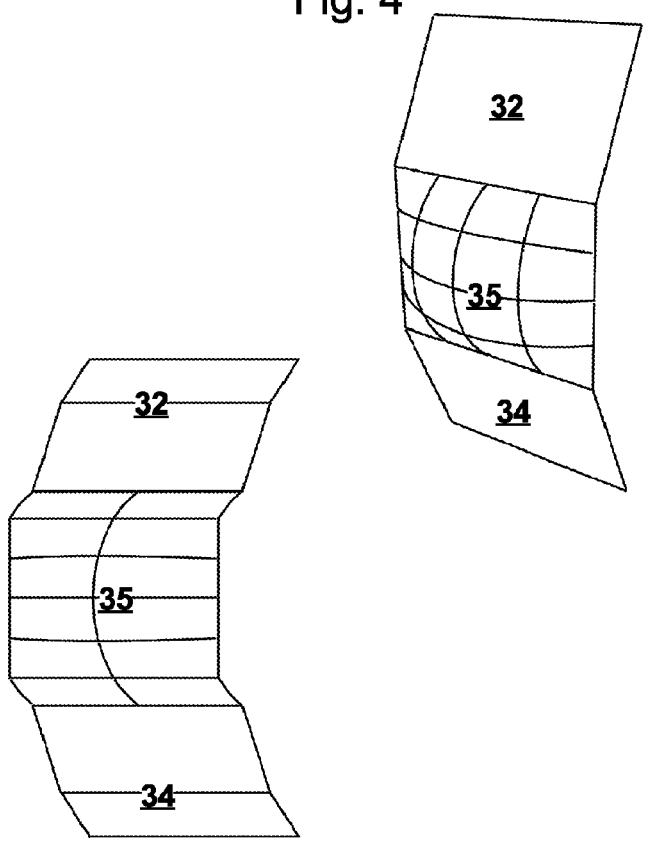
Figure 5:
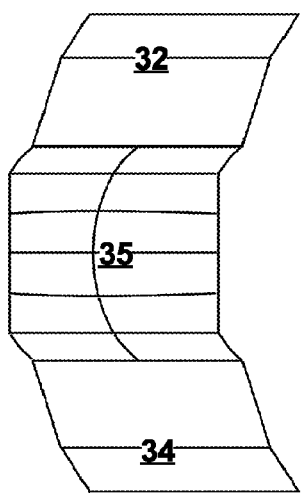

Referring to FIG. 3, it is noted that the microlens 35 may simply be provided as a cylindrical lens to match the cross sectional profile of the laser output to the cross sectional profile of the waveguide 50 by modifying the beam profile along a single dimension. Alternatively, as is illustrated in FIGS. 4 and 5, the microlens 35 may be provided as an anamorphic lens element to modify the beam profile along two orthogonal dimensions, at varying degrees of curvature. For example, where the laser diode 10 is configured to generate an output beam defining an ellipsoidal beam cross section, the microlens 35 can be configured to convert the beam to a more circular cross section by reduce the degree to which the ellipsoidal cross section varies from a circular reference.

In terms of actual scale, in the context of frequency converted laser diodes, it is noted that the facial waveguide region 55 on the input face 30 of the wavelength conversion device 20 typically covers between approximately 10 µm$^2$ and approximately 100 µm$^2$ and that the interior portion of the facial waveguide region 55 occupied by the microlens 35 covers between approximately 3 µm$^2$ and approximately 50 µm$^2$. In which case, the microlens 35 typically comprises a cylindrical lens or anamorphic lens comprising a surface component arc characterized by a radius of curvature that is less than approximately 10 µm. Aspheric microlenses comprising at least one surface component arc characterized by a radius of curvature that is less than approximately 10 µm are also contemplated.

Figure 6:
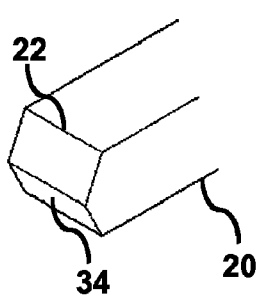
FIGS. 6-8 illustrate a variety of conversion device input face configurations according to the present disclosure.
Figure 7:
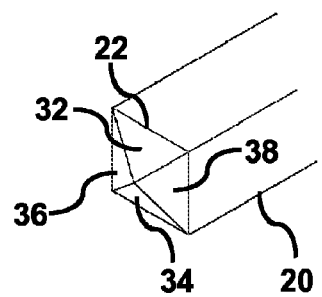
Figure 8:
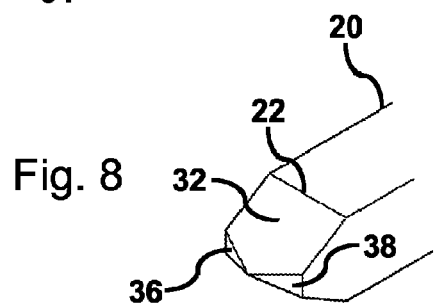

The present inventors have recognized that proximity coupling can be further facilitated by selecting appropriate facet configurations on the input face 30 of the wavelength conversion device 20. For example, referring to FIGS. 6-8, the pair of tapered facets 32, 34 can be configured to form a symmetrical or asymmetrical wedge on the input face of the wavelength conversion device. In FIGS. 7 and 8, the input face 30 of the wavelength conversion device 20 comprises an additional pair of tapered facets 36, 38 and the two pairs of tapered facets collectively form a symmetrical (FIG. 7) or asymmetrical (FIG. 8) double wedge on the input face 30 of the wavelength conversion device 20. With regard to the various facets illustrated in FIGS. 2-8, it is noted that individual ones of the facets can be unitary facets, as is illustrated in FIGS. 3 and 4, or compound facets, as is illustrated in FIG. 5.

It is noted that recitations herein of a component of the present disclosure being "configured" in a particular way, to embody a particular property, or function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present disclosure it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the subject matter of the present disclosure in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

The invention claimed is:

1. An optical package comprising a laser diode and a wavelength conversion device, wherein:
   the laser diode and the wavelength conversion device define an external laser cavity extending along an optical path between a wavelength selective component of the laser diode and an output reflector of the optical package;
   the wavelength conversion device comprises an input face, an output face, and a waveguide extending from the input face to the output face within the external laser cavity;
   the waveguide of the wavelength conversion device defines an input facial waveguide region on the input face of the wavelength conversion device;
   the laser diode is positioned such that an output face of the laser diode is proximity-coupled to the waveguide of the wavelength conversion device;
   the wavelength conversion device is tilted relative to the output face of the laser diode to define a tilt angle $\phi$ that is less than approximately 85°;
   the input face of the wavelength conversion device comprises a pair of tapered facets and a microlens;
   the pair of tapered facets and the microlens are defined on the input face such that they share respective portions of the facial waveguide region on the input face, with the tapered facets occupying peripheral portions of the facial waveguide region on the input face and the microlens occupying an interior portion of the facial waveguide region on the input face;
   each of the pair of tapered facets define a facet angle $\alpha$ within the facial waveguide region that is less than the facet angle $\alpha$ relative to the waveguide of the wavelength conversion device and is greater than approximately 45°.

2. An optical package as claimed in claim 1 wherein the microlens is bounded by the tapered facets on the input face of the wavelength conversion device.

3. An optical package as claimed in claim 1 wherein the tapered facets extend from the microlens to respective edge portions of the wavelength conversion device.

4. An optical package as claimed in claim 1 wherein the tapered facets occupy a surface area on the input face of the wavelength conversion device that is at least two orders of magnitude larger than the surface area occupied by the microlens on the input face of the wavelength conversion device.

5. An optical package as claimed in claim 1 wherein the microlens is a relatively spherical or aspherical curved surface and the tapered facets are relatively planar surfaces.

6. An optical package as claimed in claim 1 wherein the microlens defines a concave or convex profile on the input face.

7. An optical package as claimed in claim 1 wherein the microlens comprises a cylindrical lens.

8. An optical package as claimed in claim 1 wherein:
   the laser diode is configured to generate an output beam defining an ellipsoidal beam cross section; and
   the microlens is configured to reduce the degree to which the ellipsoidal cross section of the output beam varies from a circular reference.

9. An optical package as claimed in claim 1 wherein:
   the laser diode is configured to generate an output beam defining an ellipsoidal beam cross section; and
   the microlens comprises an anamorphic lens element configured to reduce the degree to which the ellipsoidal cross section of the output beam varies from a circular reference.

10. An optical package as claimed in claim 1 wherein:
    the facial waveguide region on the input face of the wavelength conversion device covers between approximately 10 $\mu m^2$ and approximately 100 $\mu m^2$; and
    the interior portion of the facial waveguide region occupied by the microlens covers between approximately 3 $\mu m^2$ and approximately 50 $\mu m^2$.

11. An optical package as claimed in claim 1 wherein the microlens comprises a cylindrical lens or anamorphic lens comprising a surface component arc characterized by a radius of curvature that is less than approximately 10 $\mu m$.

12. An optical package as claimed in claim 1 wherein the microlens comprises an aspheric lens component comprising at least one surface component arc characterized by a radius of curvature that is less than approximately 10 $\mu m$.

13. An optical package as claimed in claim 1 wherein the pair of tapered facets are configured to form a symmetrical or asymmetrical wedge on the input face of the wavelength conversion device.

14. An optical package as claimed in claim 1 wherein:
    the input face of the wavelength conversion device comprises an additional pair of tapered facets; and
    the two pairs of tapered facets collectively form a symmetrical or asymmetrical double wedge on the input face of the wavelength conversion device.

15. An optical package as claimed in claim 1 wherein each of the pair of tapered facets comprises a unitary facet or a compound facet.

16. An optical package as claimed in claim 1 wherein the laser diode is proximity-coupled to the waveguide portion of the wavelength conversion device without the use of intervening optical components.

17. An optical package as claimed in claim 1 wherein the laser diode is proximity-coupled to the waveguide portion of the wavelength conversion device by a proximity spacing of less than approximately 20 $\mu m$.

18. An optical package comprising a laser diode and a wavelength conversion device, wherein:
    the laser diode and the wavelength conversion device define an external laser cavity extending along an optical path between a wavelength selective component of the laser diode and an output reflector of the optical package;
    the wavelength conversion device comprises an input face, an output face, and a waveguide extending from the input face to the output face within the external laser cavity;
    the waveguide of the wavelength conversion device defines an input facial waveguide region on the input face of the wavelength conversion device;
    the laser diode is positioned such that an output face of the laser diode is proximity-coupled to the waveguide of the wavelength conversion device by a proximity spacing of less than approximately 20 μm and without the use of intervening optical components;

the wavelength conversion device is tilted relative to the output face of the laser diode to define a tilt angle φ that is between approximately 70° and 80°;

the input face of the wavelength conversion device comprises a pair of tapered facets and a microlens;

the pair of tapered facets and the microlens are defined on the input face such that they share respective portions of the facial waveguide region on the input face, with the tapered facets occupying peripheral portions of the facial waveguide region on the input face and the microlens occupying an interior portion of the facial waveguide region on the input face; and each of the pair of tapered facets define a facet angle α within the facial waveguide region that is less than the facet angle α relative to the waveguide of the wavelength conversion device and is greater than approximately 45°.

* * * * *